(12) United States Patent
Hasegawa

(10) Patent No.: US 7,622,804 B2
(45) Date of Patent: Nov. 24, 2009

(54) SEMICONDUCTOR DEVICE AND METHOD OF MANUFACTURING THE SAME

(75) Inventor: Koichi Hasegawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/860,560

(22) Filed: Sep. 25, 2007

(65) Prior Publication Data

US 2009/0079043 A1 Mar. 26, 2009

(30) Foreign Application Priority Data

Sep. 25, 2006 (JP) .............................. 2006-258852

(51) Int. Cl.
*H01L 23/043* (2006.01)

(52) U.S. Cl. .................. 257/709; 257/666; 257/774; 257/669; 257/671; 257/678; 257/787; 257/E29.12; 257/E29.127; 257/E23.039; 257/E23.079; 257/E23.088; 257/E23.092; 257/E23.135

(58) Field of Classification Search .................. 257/666, 257/774, 709, 787, E29.12, E29.127, E23.039, 257/E23.079, E23.088, E23.092, E23.135
See application file for complete search history.

(56) References Cited

U.S. PATENT DOCUMENTS

| 6,046,506 | A  | * | 4/2000 | Hikita et al. | ................. | 257/787 |
| 6,222,260 | B1 | * | 4/2001 | Liang et al. | ................. | 257/691 |
| 2002/0068379 | A1 | * | 6/2002 | Cobbley et al. | ............. | 438/106 |
| 2007/0085177 | A1 | * | 4/2007 | Loo et al. | .................... | 257/676 |
| 2007/0132089 | A1 | * | 6/2007 | Jiang et al. | .................. | 257/700 |

FOREIGN PATENT DOCUMENTS

| JP | 5-136312 | 6/1993 |
| JP | 9-8181 | 1/1997 |
| JP | 2003-133512 | 5/2003 |

* cited by examiner

*Primary Examiner*—Long K Tran
(74) *Attorney, Agent, or Firm*—Young & Thompson

(57) ABSTRACT

Provided is a semiconductor device including a semiconductor chip, a film (first film) which is provided so as to cover an active region with a peripheral portion of the semiconductor chip being uncovered, and is made of a dielectric material having a low dielectric constant, and a package molding resin (sealing resin) provided so as to cover the semiconductor chip and the film. As a result, deterioration in contact property with the sealing resin is suppressed and a high frequency characteristic can be enhanced.

6 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Related Art

There is generally employed a method of sealing a semiconductor chip with an epoxy resin or the like so that the semiconductor chip can be protected electrically, mechanically, or chemically from an outside. For example, the semiconductor chip is mounted onto a lead frame, and bonding pads provided on the semiconductor chip are connected to inner leads of the lead frame via bonding wires such as gold wires. After that, the semiconductor chip is sealed with the epoxy resin or the like for packaging.

The above-mentioned production method is suitable for mass production at low cost. For this reason, a full-mold package using the epoxy resin or the like is also increasingly applied to products (for example, high-power and high-frequency device), for ceramic packages are conventionally used.

However, in the case of using the epoxy resin, there was a problem in that moisture resistance deteriorates due to moisture absorption from inside the resin to the semiconductor chip. In addition, because a dielectric constant of the epoxy resin is as high as 3.9 to 4.5, there was another problem in that the parasitic capacitance (for example, gate-drain capacitance Cgd in a case of FET) was increased by the resin entering an element portion of the semiconductor chip, thereby deteriorating a high frequency characteristic.

As a technology for improving those defects, there is generally known a method involving covering and protecting a surface of the semiconductor chip with a polyimide-based resin, a silicon resin, fluorine-containing elastomer, a polymer resin, or the like.

FIG. 1 is a plan view illustrating an example of a semiconductor device according to the related art. FIG. 2 is a cross-sectional diagram taken along the line A of FIG. 1. A method of manufacturing the semiconductor device will be described. First, a semiconductor chip 101 is mounted on a lead frame 102, and is connected to inner leads of the lead frame 102 via bonding wires 103. After that, in order to improve the high frequency characteristic or protect the semiconductor chip 101, an upper portion of the semiconductor chip 101 is coated with a potting resin 105 made of fluorine-containing elastomer or a polymer resin which has a dielectric constant of as low as 2.0 to 2.4 and has high resistance to chemicals. Then, the semiconductor chip 101 is sealed for packaging with a package molding resin (sealing resin) 104 such as an epoxy resin.

As a result, the periphery of the element portion of the semiconductor chip 101 has a low dielectric constant, thereby reducing the parasitic capacitance between element electrodes and improving the high frequency characteristic. In addition, high resistance to chemicals can be obtained.

Further, JP 09-008181 A discloses a semiconductor device using a resin component whose molecules contain a carbodiimide unit (—R—N=C=N—; R is a divalent organic group) as a protective film of a semiconductor chip. The resin whose molecules contain the carbodiimide unit is dissolved in an organic solvent, which is used in a varnish state with a solution viscosity capable of application.

FIG. 3 is a cross-sectional diagram illustrating the semiconductor device disclosed in JP 09-008181 A. A silicon chip 201 is provided on a die pad of the lead frame 207 to be bonded with a gold-tin alloy, and an insulating film 202 made of silicon dioxide is formed on the surface of the silicon chip 201 into a thickness of about 100 nm. On apart of the insulating film 202, a bonding pad portion made of aluminum for drawing out an external electrode is formed and connected to a circuit. In the aluminum wiring layer, a passivation film 203 made of PSG, SiN, $SiO_2$, or the like is formed into a thickness of from 50 nm to 200 nm.

A protective film 206 made of a resin component whose molecules contain a carbodiimide unit is formed so as to cover the passivation film 203. The bonding pad portion is electrically connected to the lead frame 207 via the bonding wires 205 such as a gold wire or an aluminum wire. The entire silicon pellet is sealed with a sealing resin 208 made of a thermosetting epoxy resin. By using the protective film 206, a water absorbing property or moisture permeability can be reduced, and the higher moisture resistance can be obtained as disclosed in JP 09-008181 A.

FIGS. 4 and 5 are cross-sectional diagrams illustrating other semiconductor devices disclosed in JP 09-008181 A. In the semiconductor device of FIG. 4, varnish is used in a post process. As illustrated in FIG. 5, the protective film 206 is formed on the whole of the surface of the semiconductor chip 201 and a back surface of the die pad. Also in those semiconductor devices, the same effects can be obtained as those of the above-mentioned semiconductor device of FIG. 3.

It should be noted that the related arts of the present invention include JP 2003-133512 A and JP 05-136312 A as well as JP 09-008181 A.

However, the potting resin 105 made of fluorine-containing elastomer or a polymer resin, which is used for the semiconductor devices shown in FIGS. 1 and 2, is a material used for improving the resistance to chemicals. Accordingly, the potting resin 105 has poor compatibility with the epoxy resin or the like which is the material of the sealing resin 104, and thus, contact property between the potting resin 105 and the sealing rein 104 is hardly obtained. For this reason, a void is generated in the interface between the potting resin 105 and the sealing resin 104, which raises such problems as deterioration in moisture resistance due to entrance of water from the outside, peeling, and cracking caused by a steam explosion due to thermal hysteresis at the time of packaging. Even in the case of using the resin component whose molecules contain a carbodiimide unit, which constitutes the protective film 206 as illustrated in FIGS. 3 to 5, the contact property with the semiconductor chip is improved, thereby improving the moisture resistance. However, the resin component has a similar problem in that the contact property with the sealing resin 208 is not yet fully improved while the contact property is better than that of the fluorine-based resin.

The problem can be prevented by, for example, reducing an application area of the potting resin 105 and by covering only the active region of the semiconductor chip 101 of FIGS. 1 and 2. This is because the interface between the sealing resin 104 and the resin 105 is made smaller. However, for example, an insufficient accuracy of a dropping position in a case of potting the resin, or fluctuation of a potting amount due to ununiformity of the resin viscosity causes fluctuation of coated shapes. As a result, the active region of the semiconductor chip 101 may not be covered in this case, and the sealing resin 104 having a higher dielectric constant enters the active region of the semiconductor chip 101, thereby increasing the parasitic capacitance and reducing the high frequency characteristic which were problems. This also applied to the semiconductor device shown in FIG. 3.

The problem of the fluctuation of the coated shape may be prevented by forming the protective film 206 on the whole of the surface of the semiconductor chip and the back surface of the die pad as in the structure illustrated in FIG. 5. However, by taking the structure, an area of the interface between the sealing resin 208 and the protective film 206 becomes larger, and the above-mentioned problem of the contact property arises. In the manufacturing process for the semiconductor device, in order to stably form the protective film on the entire surfaces as in the structure of FIG. 5, a device produced at high cost is required. Further, in such a package that requires to be grounded and to radiate heat by directly exposing the back surface of the lead frame as illustrated in FIG. 2, the protective film interferes with the contact between the back surface and the ground. For this reason, the structure of FIG. 5 cannot be applied.

On the other hand, as in the related art illustrated in FIG. 3, if the protective film 206 is formed in a preprocess before forming the semiconductor chip, the above-mentioned problems may be prevented. However, in this case, since the protective film 206 is always formed between the element electrodes, even in a case where the dielectric constant of the polycarbodiimide resin is to be further reduced, from a viewpoint of the improvement of the high frequency characteristic, it is difficult to obtain a state where the resin does not exist at all between the element electrodes, that is, the dielectric constant of the resin is not lowered to be equal to or lower than the dielectric constant of the air. Therefore, there is a limitation on the improvement of the high frequency characteristic from the viewpoint of increasing the parasitic capacitance component.

SUMMARY OF THE INVENTION

According to an aspect of the present invention, there is provided a semiconductor device including: a semiconductor chip; a sealing resin provided so as to cover the semiconductor chip; and a plate-like first film which is provided between the semiconductor chip and the sealing resin so as to cover an active region with a peripheral portion of the semiconductor chip being uncovered, and is made of a dielectric material having a dielectric constant lower than that of the sealing resin.

According to another aspect of the present invention, there is provided a method of manufacturing a semiconductor device, including the steps of: bonding a plate-like first film which is made of a dielectric material having a dielectric constant lower than that of a sealing resin, and is formed in advance, so as to cover an active region with a peripheral portion of a semiconductor chip being uncovered; and forming the sealing resin so as to cover the semiconductor chip and the first film.

According to the present invention, the first film formed on the semiconductor chip is made of a dielectric material having a low dielectric constant, thereby making it possible to reduce a parasitic capacitance between the semiconductor chip and improve a high frequency characteristic. In addition, because the first film is processed into a film shape, the first film can be formed on a desired region of the semiconductor chip in a state where the shape of the film is stably maintained. As a result, an area of the interface between the sealing resin and the first film can be minimized, thereby preventing the problem of deterioration in contact property, which is inherent in the related art.

According to the present invention, it is possible to provide a semiconductor device capable of suppressing reduction in contact property with the sealing resin and improving the high frequency characteristic, and a method of manufacturing the same.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
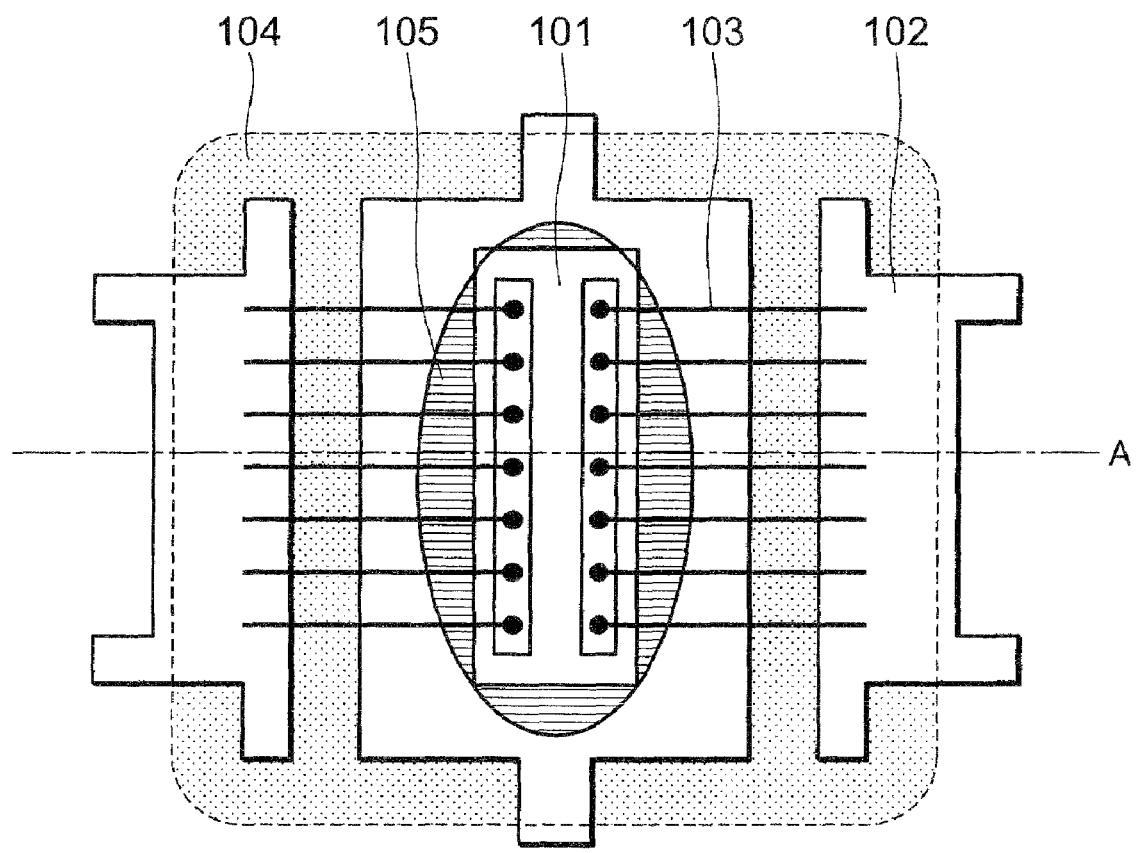
FIG. 1 is a plan view illustrating an example of a semiconductor device according to a related art.
Figure 2:
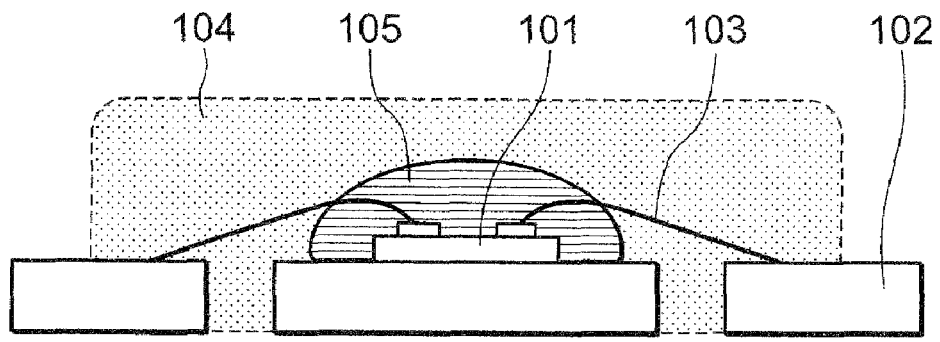
FIG. 2 is a cross-sectional diagram taken along the line A of FIG. 1.
Figure 3:
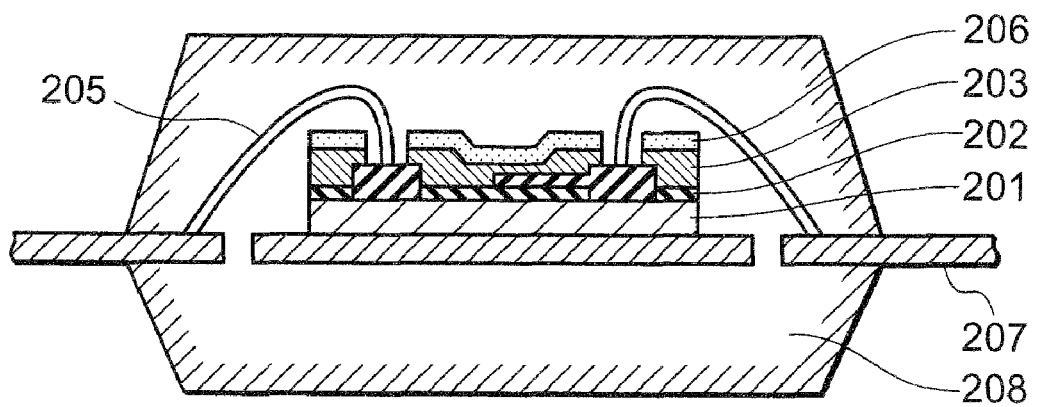
FIG. 3 is a cross-sectional diagram illustrating a semiconductor device as disclosed in JP 09-008181 A.
Figure 4:
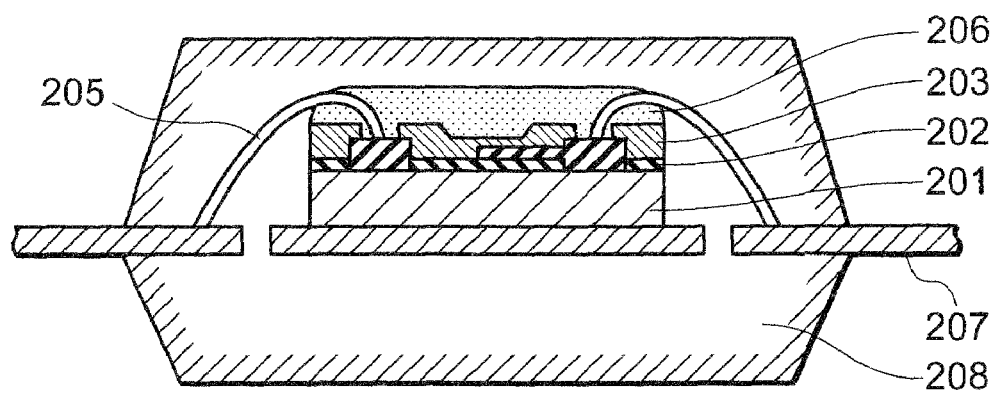
FIG. 4 is a cross-sectional diagram illustrating another semiconductor device as disclosed in JP 09-008181 A.
Figure 5:
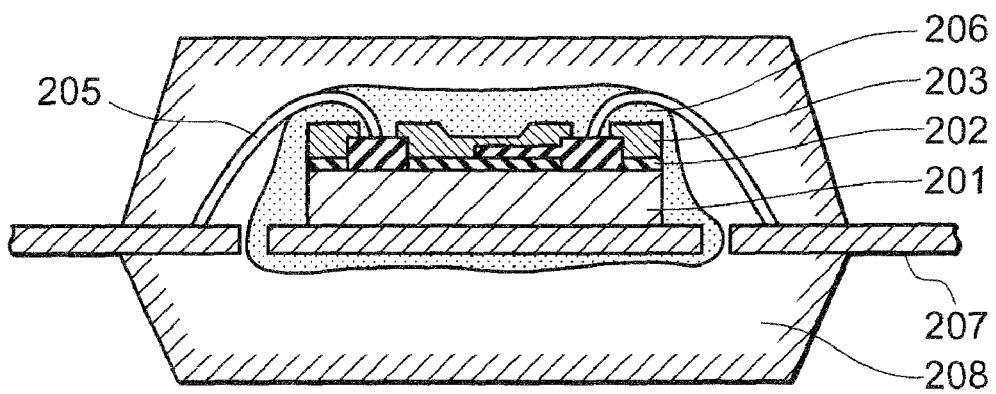
FIG. 5 is a cross-sectional diagram illustrating another semiconductor device as disclosed in JP 09-008181 A.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of a semiconductor device and a method of manufacturing the same according to the present invention will be described in detail with reference to the drawings. It should be noted that in the description with reference to the drawings, the identical components are denoted by the same reference numerals, and redundant explanations thereof are omitted.

First Embodiment

Figure 6:
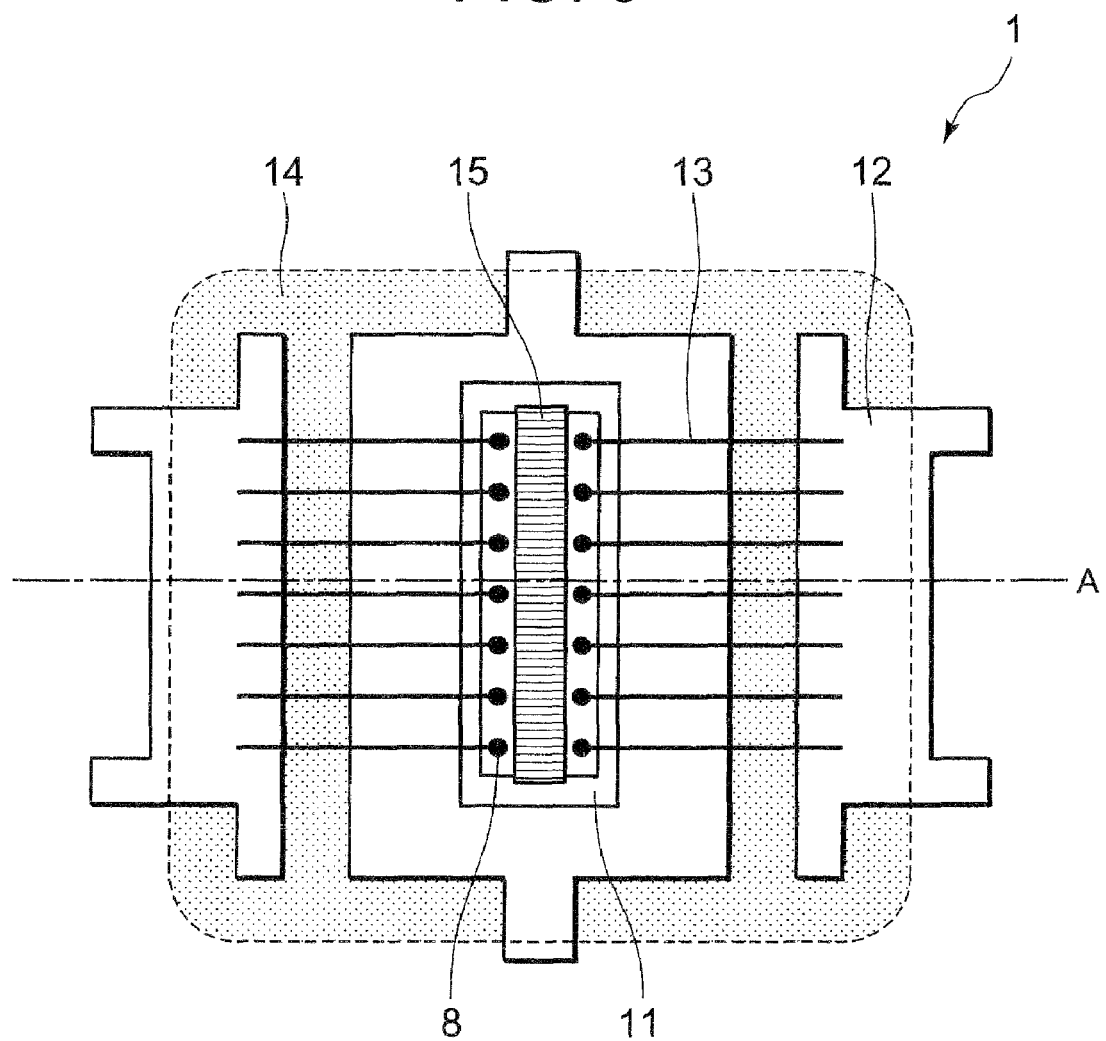
FIG. 6 is a plan view illustrating a semiconductor device according to a first embodiment of the present invention.
Figure 7:
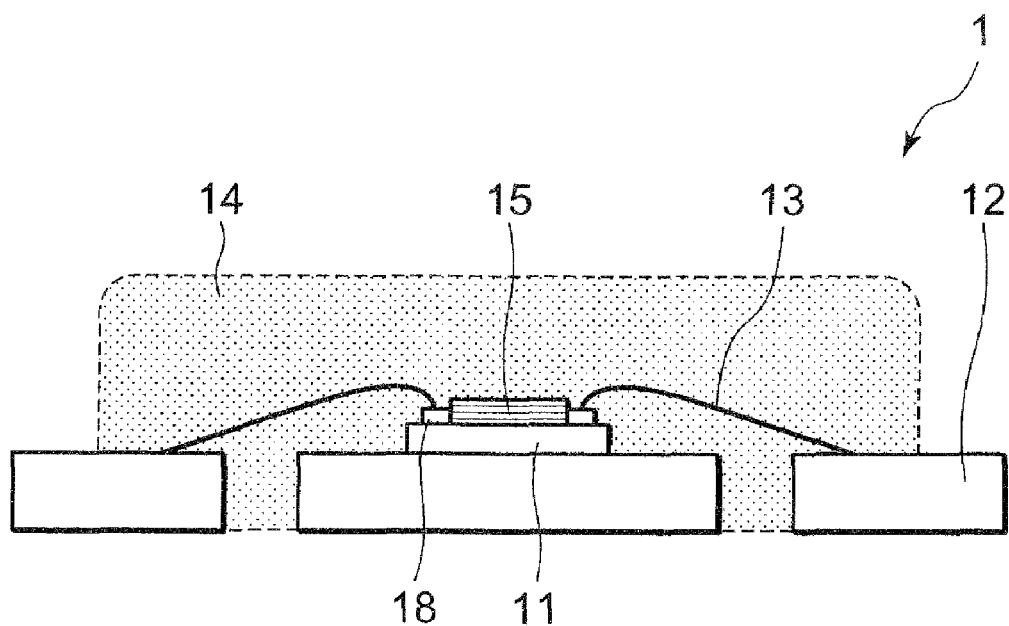
FIG. 7 is a cross-sectional diagram taken along the line A of FIG. 6.

FIG. 6 is a plan view illustrating a semiconductor device according to a first embodiment of the present invention. FIG. 7 is a cross-sectional diagram taken along the line A of FIG. 6. A semiconductor device 1 includes a semiconductor chip 11, a plate-like film 15 (first film), which is provided so as to cover an active region with a peripheral portion of the semiconductor chip 11 being uncovered, and is made of a dielectric material having a dielectric constant lower than that of a package molding resin, and a package molding resin 14 (sealing resin) provided so as to cover the semiconductor chip 11 and the film 15. In this case, the active region indicates a region of a top surface (surface on wiring layer side) of the semiconductor chip 11, in which circuit elements such as transistors or wirings are formed.

The semiconductor chip 11 is mounted on a mounting position of a lead frame 12, and bonding pads 18 disposed to the semiconductor chip 11 and inner leads of the lead frame 12 are connected to each other via bonding wires 13.

The plate-like film 15 is provided only at an inner side of the bonding pads 18. For this reason, the bonding wires 13 connected to the bonding pads 18 are not brought into contact with the plate-like film 15, and does not interfere with connection therebetween. In addition, when an effect of the film on the circuit elements or wirings and the contact property between the film and the sealing resin are taken into consideration, the film 15 is desirably formed only on the active region of the semiconductor chip 11. The dielectric material having a low dielectric constant which constitutes the film 15 is fluorine-containing elastomer or a polymer resin. Further, a material of the package molding resin 14 is an epoxy resin.

According to a method of manufacturing the semiconductor device according to the first embodiment of the present invention, an example of the method of manufacturing the semiconductor device 1 will be described. First, the semiconductor chip 11 is mounted on the lead frame 12 by use of a device such as an automatic mounter. Then, the plate-like film 15 is formed so as to cover the active region with the peripheral portion of the semiconductor chip 11 being uncovered. For example, the film 15 which is formed in advance is bonded to the semiconductor chip 11, and then a baking process is additionally performed to heat and fix the film 15 depending on the material of the film 15. In this case, since the film 15 is formed into a plate shape, the film 15 itself can be held, and when the film 15 is formed on the semiconductor chip 11, the same device as that used in the case of placing the film 15 on the lead frame 12 of the semiconductor chip 11 can be used, thereby making it unnecessary to use extra facilities. In addition, the film can be formed with the same positioning accuracy as that in the case of mounting the semiconductor chip. Subsequently, the semiconductor chip 11 and the lead frame 12 are electrically connected to each other via the bonding wires 13. After that, the semiconductor device 1 is sealed with the package molding resin 14 for packaging.

Effects of the first embodiment will be described. The film 15 provided on the semiconductor chip 11 is made of the dielectric material having a low dielectric constant, which reduces a parasitic capacitance between electrodes of the semiconductor chip 11 and enhances a high-frequency characteristic. Further, the film 15 is processed into a plate shape, which makes it possible to form the film 15 only on a desired region on the semiconductor chip 11 in a state where the shape of the film is held in a stable state. As a result, an area of an interface between the package molding resin 14 and the film 15 can be minimized, thereby preventing a problem of deterioration in contact property, which is inherent in the related art. In particular, when the film 15 is formed only on the active region, the film 15 covers only a minimum region necessary for reducing the parasitic capacitance, which can effectively prevent the problem of the deterioration in contact property.

According to the first embodiment, in the semiconductor device of a resin sealing package, the high frequency characteristic can be improved without causing problems of deterioration in moisture resistance, peeling, cracks caused by a steam explosion due to thermal hysteresis at the time of packaging, or the like. In addition, the resin sealing package can be produced at low cost, and the same high frequency characteristic as that of a package having a hollow structure or a ceramic package can be obtained. Further, the first embodiment can be applied to a semiconductor device having a package structure in which a back surface of a lead frame is exposed so as to be directly grounded and to radiate heat.

In addition, when the film 15 is formed on the semiconductor chip 11, as described above, the same device used for mounting the semiconductor chip 11 can be used. On the contrary, it is necessary for the related arts illustrated in FIGS. 1 to 5 to additionally use a device for forming the potting resin 105 or the protective film 206.

In the case where fluorine-containing elastomer or a polymer resin is used as the dielectric material having a low dielectric constant which constitutes the film 15, those materials each have a dielectric constant as low as 2.0 to 2.4, thereby obtaining the sufficient effect in reduction in parasitic capacitance. In addition, those materials have high resistance to chemicals, thereby making it possible to effectively protect the semiconductor chip 11.

Second Embodiment

Figure 8:
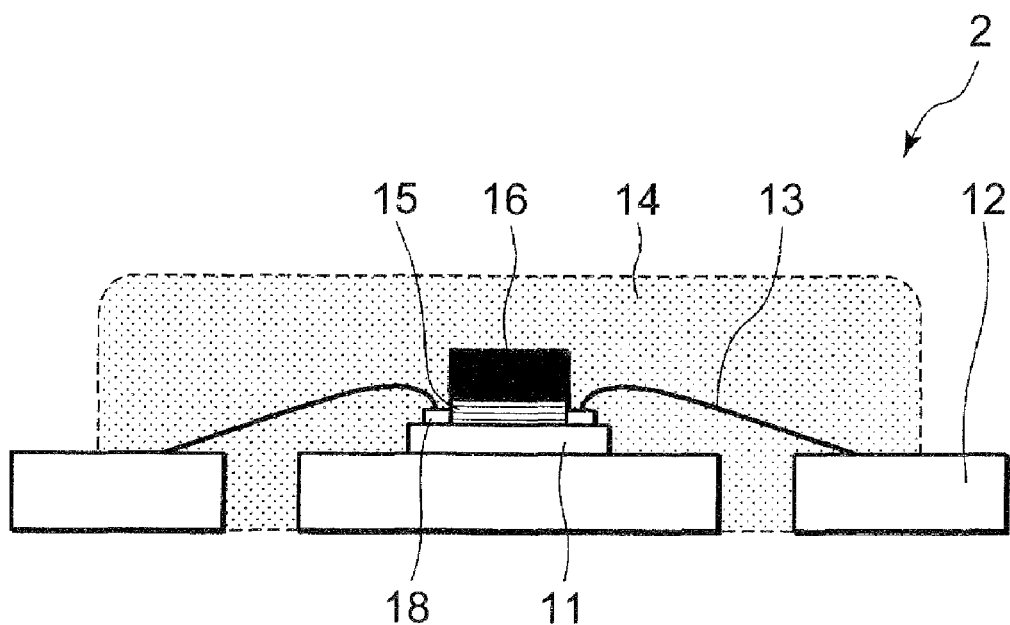
FIG. 8 is a cross-sectional diagram illustrating a semiconductor device according to a second embodiment of the present invention.

FIG. 8 is a cross-sectional diagram illustrating a semiconductor device according to a second embodiment of the present invention. A semiconductor device 2 includes a film 16 (second film) which is provided between the film 15 and the package molding resin 14 and has a higher compatibility with the package molding resin 14 than the film 15. Examples of the film 16 include an epoxy film and a polyimide-based composite film containing an epoxy resin.

As a result, the dielectric constant of the film 15 is lowered, thereby drastically improving the reduction in compatibility with the package molding resin 14 and the deterioration in contact property can be drastically improved. Other structures and effects of the second embodiment are similar to those of the first embodiment.

It should be noted that, in the second embodiment, instead of forming the film 16, the surface of the film 15 may be reformed to be hydrophilic. Also in this case, the same effects as those obtained in the case of forming the film 16 can be obtained. In order to reform the surface of the film 15 to be hydrophilic, the following methods may be employed. That is, for example, a method involving physically roughning the surface of the film 15 to be made uneven so as to make the surface hydrophilic owing to an anchor effect, a method involving chemically reforming the surface by dropping a chemical processing liquid such as liquid ammonia containing metallic sodium, naphthaline, and tetrahydrofuran, and a method involving substituting only a single atomic layer of the surface of the film 15 with a hydrophilic group by photochemical reaction. Specifically, as the method of substituting the single atomic layer with the hydrophilic group, for example, a solution ($H_2O_2$, $H_2O$, $H_3BO_3$, or the like), which includes a functional group unique to a resin such as a hydrophilic group, and atoms having bonding energy with fluorine which is equal to or larger than a C—F bond (128 kcal/mol), is dropped or atomized into mist to the surface of the film 15 so as to form a thin liquid layer 8. After that, an ultraviolet light source (ArF excimer laser/lamp, Hg lamp, or Hg—Xe lamp) with a photon energy of 128 kcal or more is irradiated thereto, and fluorine (F) is detached from the surface of the fluoric resin to be substituted with a hydrophilic group such as a B group or an OH group.

Third Embodiment

Figure 9A:
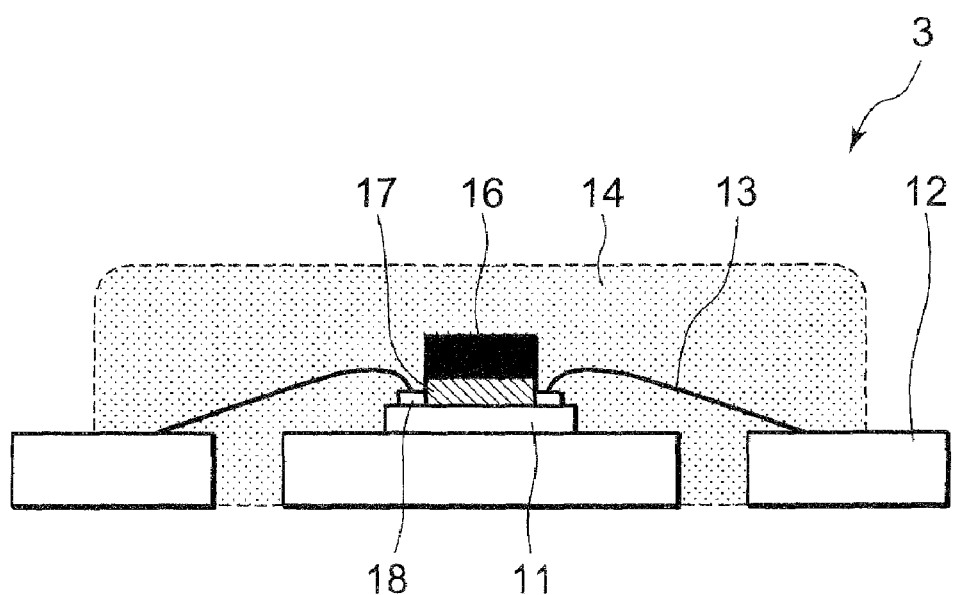
FIG. 9A is a cross-sectional diagram illustrating a semiconductor device according to a third embodiment of the present invention.

FIG. 9A is a cross-sectional diagram of a semiconductor device according to a third embodiment of the present invention. A semiconductor device 3 includes a film 17 formed therein instead of the film 15 of FIG. 8. The film 17 is made of a material which has a low dielectric constant and has a viscosity, and is applied to the film 16. A laminate film including the film 16 and the film 17 is placed on the semiconductor chip 11 in such a manner that the film 17 is formed on the semiconductor chip 11 side and the film 16 is formed on the package molding resin 14 side.

Figure 9B:
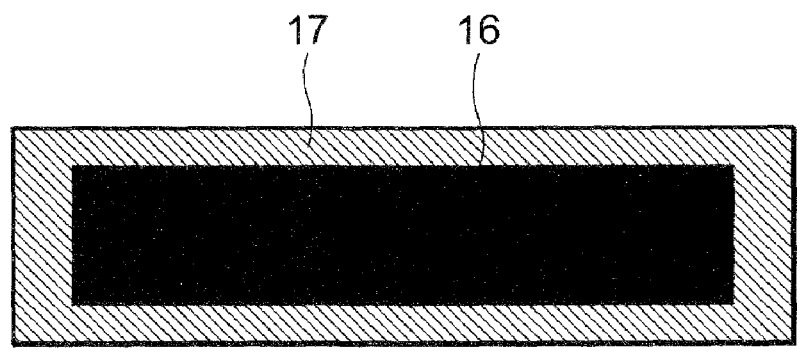
FIG. 9B is a plan view of a part of the semiconductor device of FIG. 9A viewed from a bottom side.

FIG. 9B is a plan view of the laminate film including the film 16 and the film 17, viewed from a bottom side (semiconductor chip 11 side). As illustrated in FIG. 9B, the film 17 is formed only under a peripheral portion of the film 16. For this reason, the contact property with the semiconductor chip 11 can be further improved. In addition, the laminate film has a cavity formed inside thereof, and a void is formed in the substantially entire peripheral portion of the element electrode in the active region, thereby drastically reducing the parasitic capacitance and further improving the high frequency characteristic. Other structures and effects of the third embodiment are similar to those of the second embodiment. It should be noted that, in the third embodiment, it is not essential to form the film 17 only on the peripheral portion of the film 16, but the film 17 may be formed on the entire surface of the film 16.

The semiconductor device and the method of manufacturing the same according to the present invention are not limited to the above-mentioned embodiments, but various modifications can be made.

It is apparent that the present invention is not limited to the above embodiments, but may be modified and changed without departing from the scope and spirit of the invention.

What is claimed is:

1. A semiconductor device, comprising:
   a semiconductor chip;
   a sealing resin provided so as to cover the semiconductor chip;
   a plate-like first film which is provided between the semiconductor chip and the sealing resin so as to cover an active region with a peripheral portion of the semiconductor chip being uncovered, and is made of a dielectric material having a dielectric constant lower than that of the sealing resin; and
   a second film which is provided between the first film and the sealing resin, and has higher compatibility with the sealing resin than compatibility of the first film,
   wherein the first film is in direct contact with both the semiconductor chip and the second film.

2. A semiconductor device according to claim 1, further comprising bonding pads provided on the semiconductor chip,
   wherein the first film is formed only at an inner side of the bonding pads.

3. A semiconductor device according to claim 1, wherein the first film is formed on the active region of the semiconductor chip.

4. A semiconductor device according to claim 1, wherein the dielectric material comprises one of fluorine-containing elastomer and a polymer resin.

5. A semiconductor device according to claim 1, wherein the semiconductor chip is mounted on a lead frame and connected by wire bonding.

6. A semiconductor device, comprising:
   a semiconductor chip;
   a sealing resin provided so as to cover the semiconductor chip;
   a plate-like first film which is provided between the semiconductor chip and the sealing resin so as to cover an active region with a peripheral portion of the semiconductor chip being uncovered, and is made of a dielectric material having a dielectric constant lower than that of the sealing resin; and
   a second film which is provided between the first film and the sealing resin, and has higher compatibility with the sealing resin than compatibility of the first film,
   wherein the first film is formed only under a peripheral portion of the second film.

* * * * *